US008284962B2

(12) United States Patent
Latshaw

(10) Patent No.: US 8,284,962 B2
(45) Date of Patent: Oct. 9, 2012

(54) ELECTRONIC BASS INSTRUMENT TUBE PREAMPLIFIER

(76) Inventor: Clifford William Latshaw, Pahrump, NV (US)

( * ) Notice: Subject to any disclaimer, the term of this patent is extended or adjusted under 35 U.S.C. 154(b) by 1242 days.

(21) Appl. No.: 11/327,757

(22) Filed: Jan. 9, 2006

(65) Prior Publication Data

US 2007/0160220 A1 Jul. 12, 2007

(51) Int. Cl.
*H03F 21/00* (2006.01)

(52) U.S. Cl. ............. 381/120; 381/28; 330/177; 84/267

(58) Field of Classification Search .................... 381/28, 381/120, 118, 98, 1; 330/113, 177, 180, 330/157; 361/301.1; 84/173, 267; 327/118, 327/117, 113, 100

See application file for complete search history.

(56) References Cited

U.S. PATENT DOCUMENTS

| | | | | |
|---|---|---|---|---|
| 2,270,764 | A | 1/1942 | Norgaard | |
| 2,405,515 | A * | 8/1946 | Neyzi | 333/24 R |
| 4,377,101 | A * | 3/1983 | Santucci | |
| 4,499,809 | A * | 2/1985 | Clevinger | |
| 4,526,082 | A * | 7/1985 | Ables | |
| 4,581,587 | A * | 4/1986 | Powell | |
| 4,644,289 | A * | 2/1987 | Kennedy et al. | |
| 4,672,671 | A | 6/1987 | Kennedy | |
| 4,701,957 | A * | 10/1987 | Smith | |
| 4,907,483 | A * | 3/1990 | Rose et al. | |
| 5,442,986 | A * | 8/1995 | Cota | |
| 6,191,348 | B1 * | 2/2001 | Johnson | |
| 6,271,456 | B1 * | 8/2001 | Nelson | |
| 6,792,120 | B1 * | 9/2004 | Szenics | 381/120 |
| 2004/0240147 | A1 * | 12/2004 | Hongu et al. | 361/314 |

FOREIGN PATENT DOCUMENTS

FR 2750256 * 1/1998

OTHER PUBLICATIONS

Rose, Myles S. "A Tube Primer for Guitar and Bass Player", Version 3.21 01/02.04.*
Bogen Model MX30A Installation and Operating Manual, Printed 1-70, Lear Siegler, Inc.*
www.r-390a.net/Pearls/capacitors.pdf—Replacing the Capacitors in R390A.*
R.H. Warring, Understanding Electronics, 2nd Ed. (c) 1978 R.H. Warring chapter 3, p. 10-20, chapter 6, 7, p. 37-53. (USA).
De Vito, M.J. et al., Practical Electronics for Career Preparation, vol. 1, 1st ed. 14th printing , Buck Engineering Co., Inc. (c) 1988 chapter 28, p. 28-1 to 28-6, chapter 31, p. 31-1 to 31-6, chapter 32, p. 32-1 to 32-7. (USA).

(Continued)

*Primary Examiner* — Vivian Chin
*Assistant Examiner* — Con P Tran
(74) *Attorney, Agent, or Firm* — Meyertons, Hood, Kivlin, Kowert & Goetzel, P.C.; Eric B. Meyertons

(57) ABSTRACT

An Electronic bass register musical instrument tube preamplifier includes an in line signal pre-amplification device in a Class A audio amplifier configuration. The pre-amplification device includes one or more modern thin film capacitors coupled to the output of the preamplifier circuit from the anode of half of a dual triode 12AX7 electron tube and one or more "paper in oil" capacitors. The one or more "paper in oil" capacitors are coupled to bypass and decouple to ground at the anode of half of the dual triode 12AX7 electron tube.

8 Claims, 2 Drawing Sheets

OTHER PUBLICATIONS

Rhodes, M. C., The Battle Lines of Federal Rule of Civil Procedure 8(A)(2) and the Effects on a Pro Se Litigant's Ability to Survive a Motion to Dismiss, 22 St. Thomas L. Rev. 527 2009-2010.
Gregory Mandel, The Non-Obvious Problem How the Indeterminate Nonobviousness Standard Produces Excessive Patent Grants, 42 U.C. Davis L. Rev. 57, Nov. 2008.
Gregory N. Mandel, Another Missed Opportunity the Supreme Court's Failure to Define Nonobviousness or Combat Hindsight Bias in *KSR* v. *Teleflex*, 12 Lewis & Clark L. Rev. 323, Summer, 2008.
Herder, M., Demythologizing PHOSITA, 47 Osgoode Hall L.J. 695 2009.
Merges, Robert P. , Commercial Success and Patent Standards Economic Perspectives on Innovation, 76 Cal. L. Rev. 803 1988.
Miller, J.S., Level of Skill and Long-Felt Need Notes on a Forgotten Future, 12 Lewis and Clark L. Rev 579 (2008).
U.S. Constitution.
*Fromson* v *Advance Offset Plate, Inc*, 755 F.2d 1549, 1556-57, 225 U.S.P.Q. 26 (Fed.Cir, 1985).
*Bose Corp.* v. *JBL, Inc*, 112 F.Supp.2d 138, p. 156 (D.Mass., 2000).
*Dennis* v. *Pitner*, 106 F.2d 142, 144 n. 2, 146 (7th Cir., 1939).
*Finisar Corp.* v. *DirecTV Group, Inc.*, 523 F.3d 1323, 1334 ( Fed.Cir. 2008).
*GFI, Inc.* v *Franklin Corp.*, 88 FSupp 2d 619, 633-34 (N.D.Miss., 2000).
*Kimberly-Clark Worldwide, Inc.* v. *First Quality Baby Products, LLC*, 2010 WL 3024863 n. 6 (M. D. Pa., 2010).
*Orion IP, LLC* v. *Hyundai Motor America*, 605 F.3d 967, 975 (Fed Cir., 2010).
*Presidio Components Inc.* v. *American Technical Ceramics Corp.*, 2010 WL 1462757 (S.D.Cal., 2010).
*TriMed, Inc.* v. *Stryker Corp.*, 608 F.3d 1333, 1340-42 (Fed.Cir., 2010).
*Tyco Healthcare Group LP* v. *Biolitec, Inc.*, 2010 WL 3059518 (N.D. Cal., 2010).
Bogen MX60A Public Address System Information including photos of 12AX7 preamplifier wiring and components and preamplifier section schematic, copied and photgraphed by Clifford W. Latshaw, 2011.
Photographs of large physical sized capacitors in 12AX7 preamplifier section: antique, Russian Military Surplus and AudioNote UK types, photographed by Clifford W Latshaw, 2011.
R.G. Keen, Exploring Tone Controls, Premier Guitar Magazine, Jan. 2008, p. 64.
Cianci, Bob, Sandy Nelson, Great Rock Drummers of the Sixties Revisited, (2006) p. 127, Hal Leonard Corp. USA.
Photos of Conn Organ tone generator tube chassis, by Clifford W. Latshaw, 2011.

* cited by examiner

ELECTRONIC BASS INSTRUMENT TUBE PREAMPLIFIER

The Electronic Bass Register Musical Instrument Preamplifier is an audio preamplifier section for electric bass guitar and other amplified bass register musical instruments. The basis for the Electronic Bass Instrument Tube Preamplifier invention is not in the circuit schematic that it uses, but in its use of large physically sized paper in oil capacitors combined with a modern thin film polyester capacitor in the circuit. These capacitors are coupled to one half of a 12AX7 tube. The input socket must be isolated from the ground for Radio Frequency Interference reasons.

Large physically sized paper in oil capacitors have not been manufactured for use in the western world by the general public since the 1950s, but today there has been a resurgence of their use in high end audio equipment. In the following schematic (FIG. 2) C1 is a Russian military surplus K40Y-9, or capacitor advertised as a Mylar, tin foil or aluminum foil, paper in oil capacitor, rated at 400 to 630VDC. An antique "polystyrene" paper in oil capacitor, rated at 400 VDC with an identification number of 38FS452 may also be used. C2-C3 consists of two 0.47 uf 500 to 630VDC copper foil or Russian military surplus K42Y-2, or 150 VDC molded (term used on antique U.S. capacitors) with the marking "MCI 743" paper in oil capacitors in series. C4 is a modern polyester film or "orange drop" style capacitor, and C5 is a ceramic disc capacitor. All resistors are of the ½ watt value. The B+ voltage of 153VDC is only a typical voltage, and other voltages would work equally as well with some adjustments to the values of R1, R2, and R4. A grounded metal box contains the electronic components of the Electronic Bass Instrument Tube Preamplifier.

The circuit contains one volume control in its last stage, and the Electronic Bass Musical Instrument Tube Preamplifier is designed to be placed in the signal circuit between the instrument and the amplifier.

The heater filament for the tube needs 6.3VAC routed from pins 4 and 5 to pin 9 in parallel or 12.6VDC routed from pin 4 to pin 5 in series. The heater filament circuit is not shown in the schematic (FIG. 2) but is incorporated herein as is typical in such tube circuits.

DEFINITIONS

Paper in oil capacitor: The paper in oil capacitors referred to herein are of the variety produced by high end electronics firms such as Tobias Jensen Productions A/S in Denmark. Paper in oil capacitors are also available from Russian military surplus outlets, as well as antique electronics vendors, that fit the needs for the Electronic Bass Instrument Tube Preamplifier.

The following is a general definition of a capacitor:

A capacitor is an energy storing device (a component in electronics) made up generally of two parallel conductive plates separated by a dielectric insulating material. When a voltage is applied across the plates, the electric field in the dielectric displaces electric charges, and subsequently stores the energy involved. It is assumed ideally that there are no free charges in the dielectric, and that while they are displaced, they are not free or enabled to move around as in a conductor or semiconductor. Dielectrics are categorized in two ways, polar and non-polar. Molecules where the center-of gravity of the negative and positive charges are at the same point are deemed non-polar. If those criteria are not met, the molecule is termed polar. H20, water in molecular form, for example is polar, but H2 is non-polar. Based on that generalization, there are polarized and non-polar capacitors. The plates may be actual metal foil or a metal film deposited (layered) on the insulating material. Since the first capacitor was invented, the Leyden Jar, almost every conceivable dielectric material and form has been tried by someone. Wax, electrochemical films, plastics, ceramics, glass, oils, paper, minerals, air, and many others, either alone or as a unitized combination such as paper/wax, paper/epoxy, plastic/plastic, paper/oil, plastic/oil have been used. The quality and quantity of such storage is termed capacitance.

Orange drop capacitor: polyester film capacitor [0.1 uf 400vdc]

Tube Type 12AX7/ECC83

The 12AX7/ECC83 is a miniature, high~mu twin triode, each section of which has an individual cathode connection. The construction of the 12AX7/ECC83 is such that noise and microphony are reduced to a minimum. Hum is reduced by the use of a coiled tungsten heater. A centertapped heater permits operation of the tube from either a 6.3 or 12.6 volt heater supply.

The 12AX7/ECC83 is particularly suited for use in resistance coupled voltage amplifiers such as those used in the preamplifier and input stages of Hi-Fi amplifiers, phase inverters, multivibrators and numerous industrial control circuits where high voltage gain is desired.

General Characteristics

| ELECTRICAL | | |
|---|---|---|
| Cathode | Coated, unipotential | |
| | series | paralleled |
| Heater voltage, AC or DC | 12.6 | 6.3 volts |
| Heater current | 0.15 | 0.3 amps |
| Direct Interelectrode Capacitances | with shield | without shield |
| Grid to Plate (each section) | 1.7 | 1. 7 uuf |
| Input (each section) | 1.8 | 1.6 uuf |
| Output ( section 1) | 1.9 | 0.46 uuf |
| Output (section 2) | 1.9' | 0. 34 uuf |
| MECHANICAL | | |
| Maximum Overall Dimensions | | |
| Length, | | 2 3/16 inches |
| Seated height | | 11 5/16 inches |
| Diameter | | 7/8 inches |
| Mounting position any. | | |

BACKGROUND OF THE INVENTION

In or around 1960 a change in the tone of audio amplifiers was apparent. The first transistor radios were being mass produced during this period, and a new process for manufacturing small physically sized signal capacitors was developed and used. The new capacitors were smaller and easier to mass produce.

Most musical instrument amplifiers were still tube amplifiers at this time, but they began to use the modern signal capacitors. This did not affect the tone of musical instruments in the treble register as much as it did musical instruments in the bass register (eg. Tone controls on bass guitars no longer changed the tone very noticeably, compared to what they would do when playing through an amplifier made before the advent of the new process small physically sized signal capacitors.)

In the late 1960's through the 1980's most musical instrument amplifiers began to be produced as solid state amplifiers. These amplifiers were not an improvement in tone, but an improvement in manufacturing process. By the 1980's certain amplifier and effects manufacturers began to introduce 12AX7 tube preamplifier circuits that were fairly effective in making the tone of treble register instruments richer and less distorted. Bass register instruments were not affected to the same extent, and new ways of playing the electric bass (e.g. slap picking, etc.) were developed.

Figure 1:
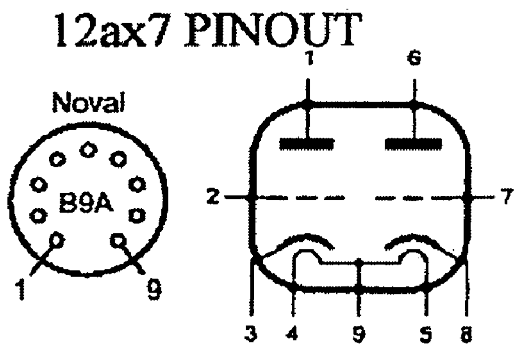
FIG. 1 is a diagram of the 9 pins on a 12AX7 tube looking at it from the bottom. Pin 1 connects to the anode, pin 3 connects to the cathode and pin 2 connects to the grid on one side of the 12AX7 tube. Pin 6 connects to the anode, pin 8 connects to the cathode and pin 7 connects to the grid on the other side of the 12AX7 tube. Pins 4, 5, and 9 connect to the heater filament.
Figure 2:
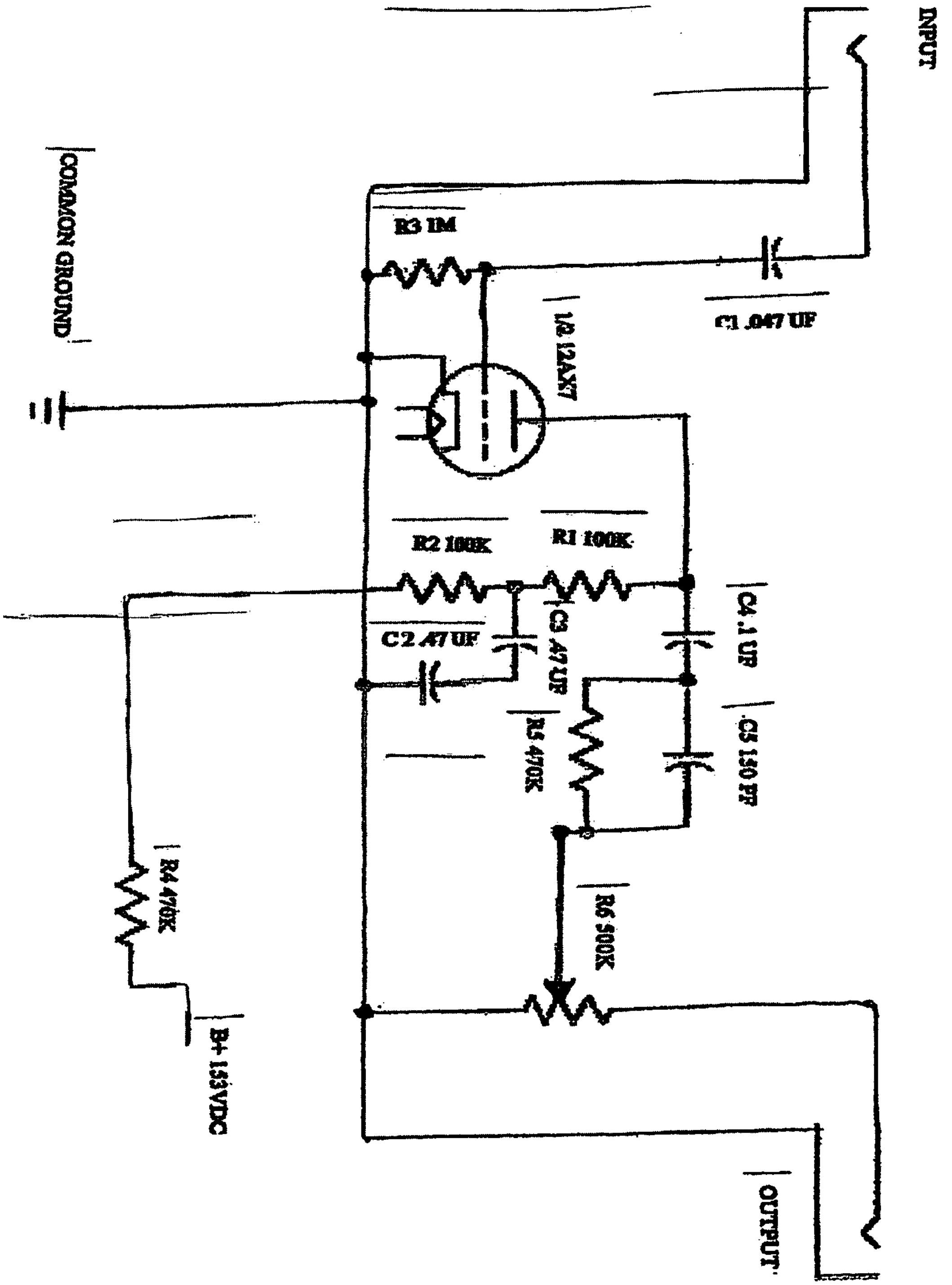
FIG. 2 is a simple schematic diagram of the Electronic Bass Instrument Tube Preamplifier.

What is claimed is:

1. An electronic bass register musical instrument tube preamplifier, comprising:

an in line pre-amplification device in a Class A audio amplifier configuration, the in line pre-amplification device comprising:

one or more modern thin film capacitors coupled to the output of the preamplifier circuit from the anode of half of a dual triode 12AX7 electron tube; and one or more "paper in oil" capacitors, wherein the one or more "paper in oil" capacitors are coupled to bypass and decouple to ground at the anode of half of the dual triode 12AX7 electron tube, wherein the one or more "paper in oil" capacitors are coupled to ground by way of one or more conductors and in parallel with one or more resistors, wherein the combination of the one or more modern thin film capacitors coupled to the output and the one or more "paper in oil" capacitors bypassing and decoupling to ground is configured to richen the tone of bass register musical instrument electronic signals, and wherein the in line pre-amplification device is configured to richen the tone of an electric bass guitar in at least the lower octave and a half of the electric bass guitar.

2. The electronic bass register musical instrument tube preamplifier of claim 1, further comprising at least one "paper in oil" capacitor coupled between an input for electronic bass register musical instrument and the grid of half of the dual triode 12AX7 electron tube.

3. The electronic bass register musical instrument tube preamplifier of claim 1, wherein at least one of the modern thin film capacitors coupled to the output of the preamplifier circuit from the anode of half of a dual triode 12AX7 electron tube comprises a polyester "orange drop" style capacitor.

4. The electronic bass register musical instrument tube preamplifier of claim 1, wherein at least one of the modern thin film capacitors coupled to the output of the preamplifier circuit from the anode of half of a dual triode 12AX7 electron tube comprises a polyester orange drop style capacitor, the preamplifier further comprising at least one ceramic capacitor coupled in series with the polyester "orange drop" capacitor.

5. The electronic bass register musical instrument tube preamplifier of claim 1, wherein the capacitance of the one or more "paper in oil" capacitors coupled to bypass and decouple to ground at the anode of half of the dual triode 12AX7 electron tube is at least about 0.235 microfarads.

6. The electronic bass register musical instrument tube preamplifier of claim 1, wherein the at least one of the one or more "paper in oil" capacitors coupled to bypass and decouple to ground at the anode of half of the dual triode 12AX7 electron tube is a Russian military surplus capacitor.

7. The electronic bass register musical instrument tube preamplifier of claim 1, wherein the at least one of the one or more "paper in oil" capacitors coupled to bypass and decouple to ground at the anode of half of the dual triode 12AX7 electron tube is a K42Y-2 Russian military surplus capacitor or equivalent.

8. The electronic bass register musical instrument tube preamplifier of claim 1, wherein the at least one of the one or more "paper in oil" capacitors coupled to bypass and decouple to ground at the anode of half of the dual triode 12AX7 electron tube is a K42Y-2 Russian military surplus capacitor.

* * * * *